(12) United States Patent
Boos et al.

(10) Patent No.: US 10,015,037 B2
(45) Date of Patent: Jul. 3, 2018

(54) GENERATION OF A TRANSMISSION SIGNAL

(75) Inventors: Zdravko Boos, Munich (DE); Victor da Fonte Dias, Neubiberg (DE); Thomas Mayer, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 12/136,078

(22) Filed: Jun. 10, 2008

(65) Prior Publication Data

US 2008/0317167 A1    Dec. 25, 2008

(30) Foreign Application Priority Data

Jun. 19, 2007    (DE) .................. 10 2007 028 066

(51) Int. Cl.
*H04L 27/36*     (2006.01)
*H03F 3/24*     (2006.01)

(52) U.S. Cl.
CPC ............. *H04L 27/361* (2013.01); *H03F 3/24* (2013.01); *H03F 2200/324* (2013.01); *H03F 2200/408* (2013.01); *H03F 2200/504* (2013.01)

(58) Field of Classification Search
CPC ... H04L 27/361; H03F 3/24; H03F 2200/504; H03F 2200/324; H03F 2200/408
See application file for complete search history.

(56) References Cited

U.S. PATENT DOCUMENTS

| | | | | |
|---|---|---|---|---|
| 7,570,182 B2* | 8/2009 | Sheba et al. | | 341/118 |
| 7,573,955 B2* | 8/2009 | Gazsi | | 375/327 |
| 7,787,563 B2* | 8/2010 | Tal et al. | | 375/297 |
| 7,817,747 B2* | 10/2010 | Waheed et al. | | 375/298 |
| 2005/0237121 A1* | 10/2005 | Hirano et al. | | 331/16 |
| 2005/0265481 A1* | 12/2005 | Bellaouar et al. | | 375/308 |
| 2006/0034391 A1* | 2/2006 | Belot et al. | | 375/308 |
| 2006/0119493 A1* | 6/2006 | Tal et al. | | 341/143 |
| 2006/0203922 A1* | 9/2006 | Rezeq | | 375/247 |
| 2007/0008199 A1* | 1/2007 | Rezeq et al. | | 341/118 |
| 2007/0030939 A1* | 2/2007 | Gazsi | | 375/376 |
| 2008/0020721 A9* | 1/2008 | Morris et al. | | 455/103 |
| 2008/0068236 A1* | 3/2008 | Sheba et al. | | 341/118 |

FOREIGN PATENT DOCUMENTS

EP          0805564 A2    11/1997

\* cited by examiner

*Primary Examiner* — Kenneth Lam
(74) *Attorney, Agent, or Firm* — Schwegman Lundberg & Woessner, P.A.

(57) ABSTRACT

One embodiment covers an apparatus for generating a transmission signal. The apparatus may include a signal generator that generates a first signal with a first frequency spectrum comprising a carrier frequency; a power control unit that provides a power information signal which represents a signal level of the transmission signal residing at the carrier frequency; a first signal shaper for noise-shaping the first signal based on the power information signal to form a second signal which has a noise component in at least one frequency range remote from the carrier frequency, the noise component of the second signal being from one or more signal components associated with the carrier frequency; and a signal output that provides the second signal in the form of a transmission signal.

22 Claims, 5 Drawing Sheets

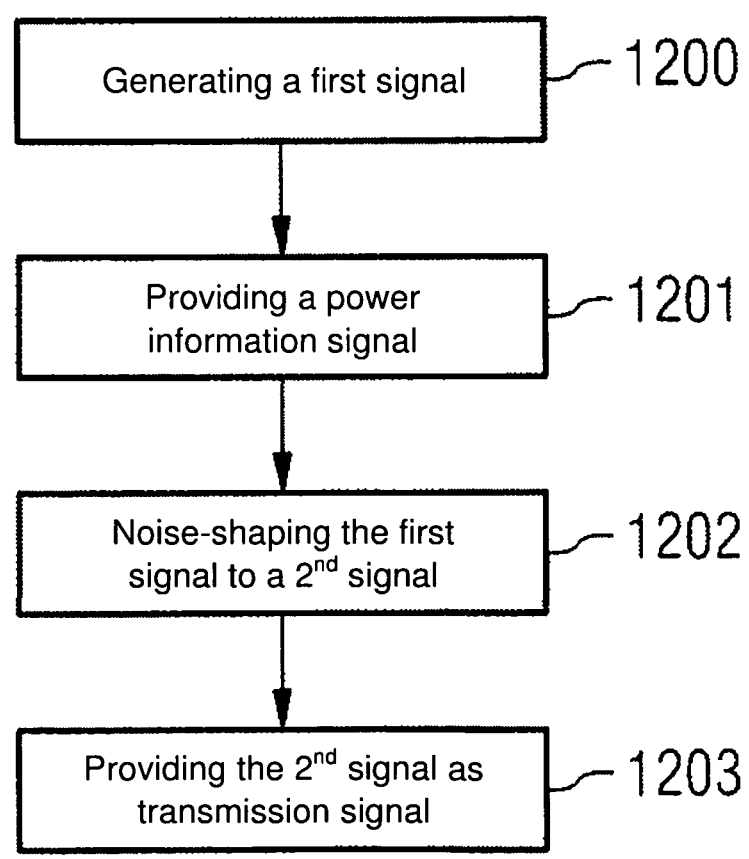

GENERATION OF A TRANSMISSION SIGNAL

The present disclosure relates to techniques for generation of a transmission signal, as for example a transmitting apparatus for transmitting a communication signal and a method for transmitting a communication signal.

BACKGROUND

In a communication system, a transmitting apparatus is used to convert a useful signal into an output signal. For this purpose, a frequency signal is modulated based on information comprised in the useful signal. The output signal is transmitted in the form of a transmission signal via a communication channel, such as a data cable or a radio channel. In a receiver, the received transmission signal is demodulated to provide the restored information in a form which enables further signal processing.

In the communication channel, a multiplicity of interferers distorts the transmission signal. These effects may include thermal noise present in the transmitting apparatus. Other transmission signals in the communication signal or interference signal of electrical devices are likewise responsible for interfering with or degrading the transmission signal. Another source of signal degradation is attenuation of the transmission signal due to spatial separation of the transmitting apparatus and the receiver. For successful transmission of the information contained in the useful signal, the output signal has to be provided at a signal level sufficiently large for the received transmission signal to be processed by the receiver.

Modern communication systems, and in particular wireless communication systems, have a large dynamic range for the signal level. This is the case, inter alia, for amplitude-modulated transmission systems. One example is a communication system defined in the so-called Universal Mobile Telecommunication Standard (UMTS). Another example is the so-called High Speed Uplink Packet Access (HSUPA) Standard.

The RMS power (root mean square power) of the transmitting apparatus is used to indicate the average power level of the transmitting apparatus without interference or overdriving. In a UMTS or HSUPA system, said power is approximately 35-40 dB in relation to a minimum output power required. In addition, the different standards impose additional demands on the power level of the transmitter of up to 80 dB. Overall, the dynamic range of a transmitter using amplitude modulation may range between 115 dB to 120 dB.

In known transmitting apparatus, an amplifier unit adjusts the transmission signal at the required output power. E.g., in polar transmitter architecture, the output power may be set in an amplitude branch of the transmitter. If necessary, a further setting operation is carried out by controlling an operating point of an amplifier in the phase branch of the transmitter. For the case of so-called polar modulator architecture, the power may be adjusted by setting the output power in the amplitude branch of the transmitter. If necessary, provision is made for a further setting operation by means of pre-amplification, e.g. by a controlled amplifier or a variable gain amplifier (VGA). In all known architecture, the achievement of a large dynamic range is associated with particular expenditure. E.g., when a VGA is used, setting of the output power requires additional control of the temperature response of the VGA.

BRIEF DESCRIPTION OF THE DRAWINGS

The detailed description is described with reference to the accompanying figures. In the figures, the left most digits of a reference number identify the figure in which the reference number first appears. The use of the same reference number in different instances in the description and the figure may indicate similar or identical items.

FIG. 12 shows a flow diagram of an implementation of a method for generating a transmission signal.

DETAILED DESCRIPTION

Figure 1:
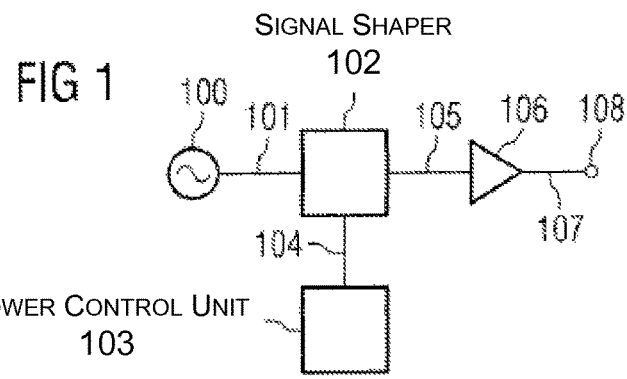
FIG. 1 shows a block diagram of an implementation of an apparatus for generating a transmission signal.

Disclosed herein are techniques for generating a transmission signal. A method and an apparatus are provided, wherein a first signal is generated. The first signal has a first frequency spectrum comprising a carrier frequency. A power information signal that represents a signal level of a transmission signal is provided. The first signal is noise-shaped based on the power information signal, so to form a second signal that comprises noise components in at least one frequency range remote from the carrier frequency. The transmission signal derives from the second signal.

The disclosed technique makes use of noise-shaping the first signal to form a second signal. Signal components are shifted from the carrier frequency to a sideband. The sideband comprises at least one frequency range remote from the carrier frequency. Therefore, the carrier frequency is not included in the frequency range. The signal level on the carrier frequency is controlled by shifting components from the carrier frequency to the sideband. The amplitude of the second signal at the carrier frequency reduces by the shifted component. The greater the shifted component, the greater the attenuation of the signal amplitude at the carrier frequency.

Further carrier frequencies, which may also form a carrier frequency band, are provided in some transmission systems, for example spread-coded transmission systems such as a Code Division Multiple Access (CDMA) transmission system. In according systems, the frequency range is located outside the carrier frequency band in an analogous manner.

As result of the noise-shaping technique, it is no longer necessary to adapt the amplitude of the second signal over the entire frequency spectrum. The amplitude is controlled only with regard to the carrier frequency. However, the peak-to-peak voltage of the second signal may remain unchanged. The demands imposed on setting the level in an amplitude path of the transmitting apparatus are therefore relaxed in the context of amplitude modulation.

The techniques described herein may be implemented in a number of ways. Exemplary environments and contexts are provided below with reference to the included figures and ongoing discussion.

Exemplary Embodiments

One embodiment of the disclosure relates to an apparatus that comprises a signal generator for generating a first signal with a first frequency spectrum comprising a carrier frequency. Provision is made of a power control unit for providing a power information signal, which represents an item of information relating to a signal level of the transmission signal. Provision is made of a first signal shaper for noise-shaping the first signal based on the power information signal to form a second signal that has noise components in at least one frequency range remote from the carrier frequency. The embodiment also comprises an amplifier for amplifying the second signal and a signal output for providing the second signal in the form of a transmission signal.

In one embodiment, at least part of the operation of setting the signal level is carried out using an oscillator signal, for example at a local oscillator or in a phase path of a transmitting apparatus. This may be particularly advantageous for use in a phase-modulated transmission system. As a result of a higher signal level of the oscillator signal, crosstalk of the latter and the phase modulation with signals in an antenna is reduced.

One embodiment provides a second signal shaper and a method step for suppressing the noise components of the second signal. Not only part of the signal energy is thus shifted from the carrier frequency to another frequency range for the purpose of control. In addition, the amplitude of the second signal is reduced over the entire frequency range. This measure may particularly advantageous if a spectrally pure transmission signal is to be provided. A spectrally pure transmission signal means that the signal-to-noise ratio (SNR) is intended to be as large as possible. E.g., a SNR of more than 22 dB is required by the UMTS standard.

The second signal shaper may be in the form of a filter, as for example a bandpass filter whose band mid-frequency essentially corresponds to the carrier frequency and whose cut-off frequencies ensure that the noise components in the frequency range remote from the carrier frequency are suppressed to the greatest possible extent.

In one embodiment, the second signal shaper connects downstream of the amplifier. The amplitude of the second signal at the input of the amplifier is therefore constant. As result, the demands imposed on setting the level in an amplitude path of the transmitting apparatus are relaxed further.

In one embodiment, the second signal shaper connects upstream of the amplifier. The amplifier may compensate for the attenuation caused by the second signal shaper.

In one embodiment, the amplifier comprises a switching amplifier. E.g., the amplifier may be in the form of a CMOS transistor. The use of the switching amplifier in conjunction with a downstream second signal shaper allows for a very efficient circuit architecture in which the amplitudes of the second signal respectively assume a constant maximum value in a signal path upstream of the amplifier and in a signal path between the amplifier and the second signal shaper.

In one embodiment, the amplifier comprises an analogue amplifier. In this case, it is also conceivable for the amplifier to comprise both at least one analogue amplifier and at least one switching amplifier. The analogue amplifier may be in the form of a single-ended amplifier or a push-pull amplifier.

In one embodiment, a first input for supplying a phase modulation signal connects to the signal generator. The signal generator is set up such that it generates the first signal based on the phase modulation signal. This measure is particularly suitable in a transmitting apparatus that generates a phase-modulated or quadrature-modulated transmission signal. In this case, it is particularly suitable for an architecture that uses polar coordinates to represent the information. The phase information is already applied in the signal generator. This may be achieved, for example, by virtue of the signal generator being in the form of a voltage-controlled oscillator (VCO) or an analogue or digital phase-locked loop (PLL). It is likewise conceivable for the transmitting apparatus to be set up for quadrature amplitude modulation and for a phase component to be modulated onto the first signal.

In one embodiment, a second input connects to the power control unit. An amplitude modulation signal may be supplied to the power control unit via the second input. The power control unit is disposed to generate the power information signal based on the amplitude modulation signal.

Said embodiment makes it possible to apply the amplitude information of quadrature amplitude modulation to the second signal. The amplitude modulation is carried out by shifting signal components from the carrier frequency to the frequency range remote from the carrier frequency. In conjunction with phase modulation in the signal generator, the second signal at the output of the first signal shaper contains the information relating to the useful signal as a result of phase and amplitude modulation. Low-complexity architecture of a polar modulator is achieved.

In one embodiment, the first signal shaper comprises a delta-sigma modulator. The latter generates a pulse current based on an analogue input signal. The power information signal in analogue form may be provided as the input signal, for example. The delta-sigma modulator may be in the form of a first-order delta-sigma modulator or in the form of a higher-order delta-sigma modulator.

In one embodiment, the first signal is supplied to the delta-sigma modulator in the form of a clock signal. This makes it possible to sample the power information signal without having to provide an additional clock signal.

In one embodiment, the first signal is supplied to the delta-sigma modulator via a frequency divider. This measure makes it possible to oversample the power information signal. For this purpose, the frequency divider may be in the form of an integral divider with a division factor of greater than the value "1". A possible value of the division factor is 2, 4, . . . , or else an uneven integer or a rational number.

Exemplary Systems

FIG. 1 shows a block diagram of an implementation of an apparatus for generating a transmission signal. The apparatus has a signal generator 100 for generating a first signal with a first frequency spectrum that comprises a carrier frequency. The signal generator 100 connects to a first signal shaper 102 by means of a first signal line 101. The apparatus also comprises a power control unit 103. The power control unit 103 connects to the first signal shaper 102 by means of a second signal line 104. The power control unit 103 provides the first signal shaper 102 with a power information signal, or transmits the latter to said signal shaper, by means of the second signal line 104.

The power information signal represents a signal level of the transmission signal. This signal level may correspond to a peak power of the transmission signal. It is likewise possible for the signal level to vary based on an item of information relating to amplitude modulation. A change in the signal level based on amplitude modulation will usually take place on considerably shorter time scales, i.e. at higher frequencies, than a change in the peak power of the transmission signal.

The first signal shaper 102 connects to an amplifier unit 106 by means of a third signal line 105. The first signal shaper 102 provides the amplifier unit 106 with the second signal by means of the third signal line. The amplifier unit 106 connects to an output 108 by means of a fourth signal line 107. It amplifies the second signal and provides a transmission signal at the output 108.

The first signal shaper 102 noise-shapes the first signal based on the power information signal to form a second signal. The first signal shaper 102 generates the second signal by shifting components of the first signal from the carrier frequency to a frequency range remote from the carrier frequency. The second signal has noise components in at least one frequency range remote from the carrier frequency. A portion of the signal energy of the first signal is shifted to a noise band. The signal power at the carrier frequency is reduced.

An exemplary noise-shaping process is explained below with reference to FIG. 2 and FIG. 3.

Figure 2:
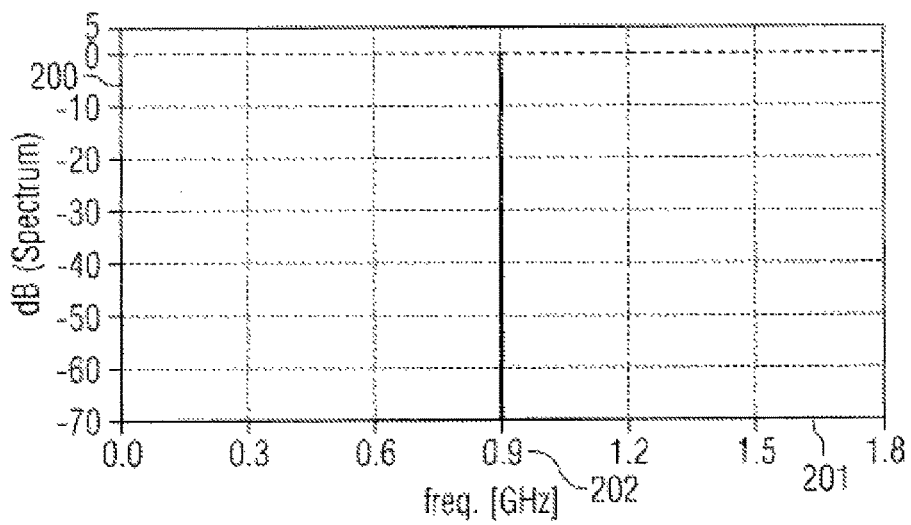
FIG. 2 shows an exemplary illustration of a spectrum of the first signal.

FIG. 2 shows an exemplary illustration of a spectrum of the first signal. In this case, a power level in decibels (dB) of the output power of the signal generator 100 is plotted on an ordinate 200 against an abscissa 201. The abscissa 201 extends over a frequency band that is stated, by way of example, as being from 0 GHz to 1.8 GHz. In the exemplary embodiment shown, the signal generator 100 generates a carrier frequency 202 of approximately 900 MHz, which corresponds to a transmission frequency in a frequency band of a GSM system or a GSM EDGE system. In the spectrum shown, the signal generator 100 generates a first signal which is provided on the first signal line 101 and the signal energy of which is concentrated on the carrier frequency 202. The spectrum accordingly has a sharp peak of the power level at the carrier frequency 202. However, the peak or noise components often spread(s) such that it/they is/are remote from the carrier frequency 202 on account of thermal noise, manufacturing inaccuracies, etc. In order to illustrate the effect of the first signal shaper 102, an illustration of this distortion has been dispensed with.

Figure 3:
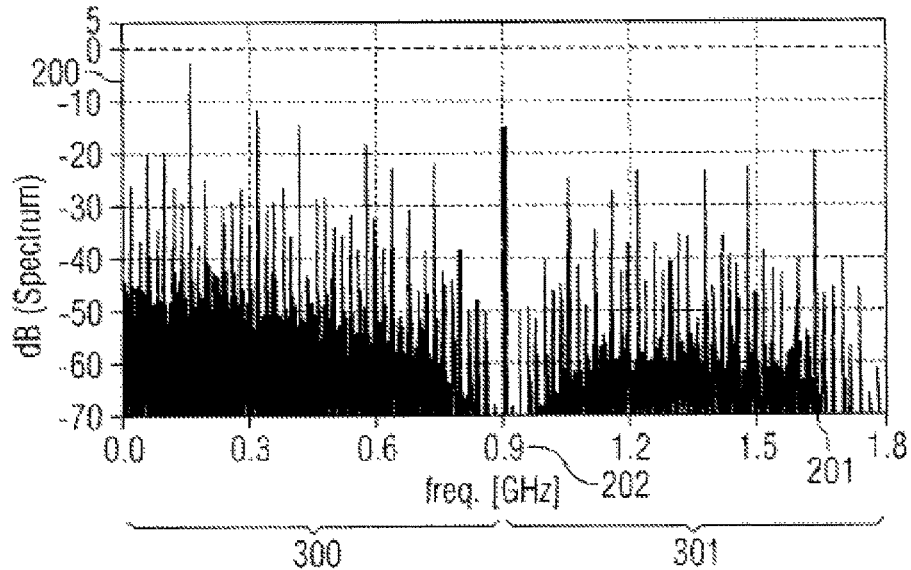
FIG. 3 shows an exemplary illustration of a spectrum of the second signal at an output of the first signal shaper.

FIG. 3 shows an exemplary illustration of a spectrum of the second signal. As in FIG. 2, a power level in dB of the output power of the signal generator 100 is plotted on an ordinate 200 against an abscissa 201. The abscissa 201 extends over a frequency band that is stated, by way of example, as being from 0 GHz to 1.8 GHz.

The first signal shaper 102 generates the second signal from the first signal provided on the first signal line 101. It provides the second signal on the third signal line 105. The spectrum has a peak of the power level above the carrier frequency 202. At the carrier frequency 202, the power of the second signal is reduced by −15 dB in comparison with the output power of the signal generator 100. In addition, the spectrum has a first frequency range 300 and a second frequency range 301. The first frequency range 300 is below the carrier frequency 202 and is remote from the latter. The second frequency range 300 is above the carrier frequency 202 and is remote from the latter.

The method of operation of the first signal shaper 102 is illustrated by comparing FIG. 2 and FIG. 3. The first signal shaper 102 shifts components of the spectrum from the carrier frequency 202 to the first frequency range 300 and the second frequency range 301. As a result, the power level at the carrier frequency 202 in the second signal is reduced in comparison with the first signal. The signal energy is shifted in noise components via the first frequency band 300 and the second frequency band.

One or several features of embodiments of an apparatus for generating a transmission signal according to the disclosed technique may be arranged, in particular, in a transmitting apparatus.

Figure 4:
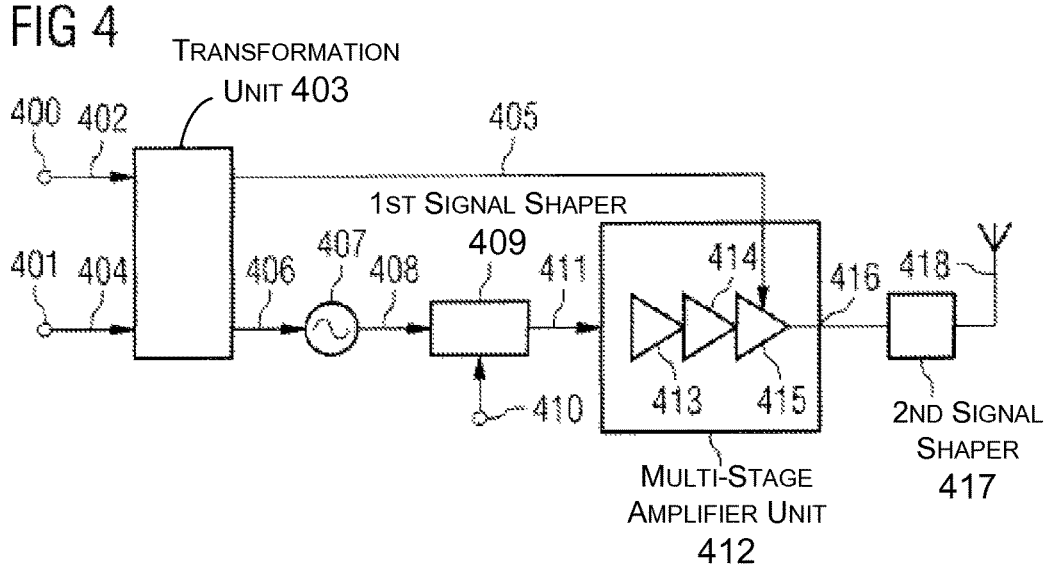
FIG. 4 shows a block diagram of an implementation of a polar modulator embodiment of the transmitting apparatus.

FIG. 4 shows a block diagram of an implementation of a polar modulator embodiment of the transmitting apparatus. The transmitting apparatus has a first input 400 for supplying an in-phase component of a useful signal comprising an item of information to be transmitted. The transmitting apparatus also has a second input 401 for supplying a quadrature component of the useful signal. The first input 400 connects to a transformation unit 403 by means of a first signal line 402. The second input 401 connects to the transformation unit 403 by means of a second signal line 404.

A baseband-processing device not illustrated in FIG. 4 provides the quadrature-modulated input signals. In different embodiments, said device comprises a microprocessor or a logic switching mechanism, for example a microcontroller or DSP. The baseband-processing device may be arranged on the same semiconductor component as the transmitting apparatus or may be arranged separately. Different partitioning on different components is likewise conceivable.

The transformation unit 403 uses the supplied in-phase component and the supplied quadrature component to determine a representation of the useful signal using polar coordinates. It provides an amplitude component of the useful signal on a third signal line 405 and a phase component of the useful signal on a fourth signal line 406.

The transformation unit 403 connects to a phase modulator 407 by means of the fourth signal line 406. The phase modulator 407 modulates the phase component onto a carrier frequency, i.e. onto a transmitting frequency of the transmitting apparatus. For this purpose, the phase modulator 407 may be in the form of a digital or analogue phase-locked loop or PLL. A first signal is provided on a fifth signal line 408 at the output of the phase modulator 407. The phase modulator 407 connects to a first signal shaper 409 by means of the fifth signal line 408. The first signal shaper 409 further connects to a third input 410. A power information signal is provided at the third input 410. The first signal shaper 409 noise-shapes the first signal based on the power information signal to form a second signal that has noise components in at least one frequency range remote from the carrier frequency. The first signal shaper 409 provides the second signal on a sixth signal line 411. The first signal shaper 409 connects to a multistage amplifier unit 412 by means of the sixth signal line 411.

The multistage amplifier unit 412 has a first amplifier stage 413, a second amplifier stage 414 and an output amplifier stage 415. The output amplifier stage 415 connects to the transformation unit 403 by means of the third signal line 405. The amplitude component is supplied to the output amplifier stage 415 by means of the third signal line 405. The multistage amplifier unit 412 amplifies the second signal, an according gain factor of the output amplifier stage

415 being derived from the amplitude component. This may be achieved, for example, by setting the supply voltage or the operating point of the output amplifier stage 415 based on the amplitude component. The amplitude component is modulated onto the second signal in this manner in the output amplifier stage 415. An amplitude-modulated and phase-modulated third signal is provided at an amplifier output 416 of the multistage amplifier unit 412.

The amplifier output 416 connects to an antenna 418 via a second signal shaper 417. The second signal shaper 417 is, for example, in the form of a bandpass filter having a band mid-frequency at the carrier frequency or in the vicinity of the carrier frequency. The second signal shaper 417 suppresses at least signal components of the third signal in the frequency range remote from the carrier frequency. The second signal shaper 417 may be referred to as a "reconstruction filter".

Consequently, the signal emitted via the antenna 418 has a spectrum in which the signal energy is concentrated around the transmission frequency, while noise components in sidebands are suppressed. Such architecture may be matched in a particularly efficient manner to spectral requirements that are imposed on the transmitting apparatus by a transmission standard.

Figure 5:
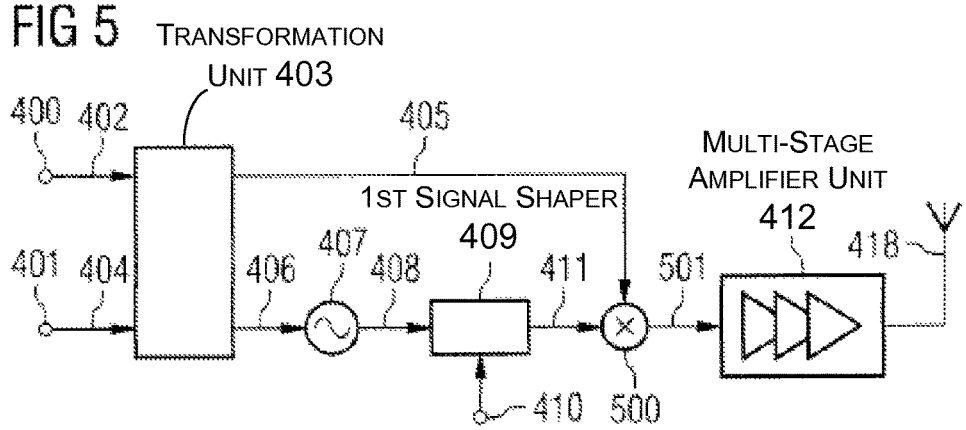
FIG. 5 shows a block diagram of an implementation of a polar transmitter embodiment of the transmitting apparatus.

FIG. 5 shows a block diagram of an implementation of a polar transmitter embodiment of the transmitting apparatus. Similar to the polar modulator embodiment, the polar transmitter embodiment of the transmitting apparatus has a first input 400, a second input 401, a first signal line 402, a transformation unit 403, a second signal line 404, a third signal line 405, a fourth signal line 406, a phase modulator 407, a fifth signal line 408, a first signal shaper 409, a third input 410 and a sixth signal line 411. These elements connect to one another in the same manner as in the polar modulator embodiment. The third signal line 405 connects to a first mixer input of a multiplier 500. The sixth signal line 411 connects to a second mixer input of the multiplier 500. In the multiplier 500, the amplitude signal is modulated onto the phase signal, which has been modulated and noise-shaped and is provided on the sixth signal line 411. An amplitude-modulated and phase-modulated signal is provided on a seventh signal line 501 that connects to a mixer output of the multiplier 500.

The multiplier 500 connects to a multistage amplifier unit 412 by means of the seventh signal line 501. The amplitude-modulated and phase-modulated signal is amplified in said amplifier unit to form an output signal. The output of the amplifier unit 412 connects to an antenna 418.

The polar transmitter embodiment allows simple implementation of a transmitting apparatus. It may contain a reconstruction filter that shapes the spectrum of the output signal by suppressing noise components. The amplifier unit 412 may comprise analogue amplifiers or switching amplifiers.

Figure 6:
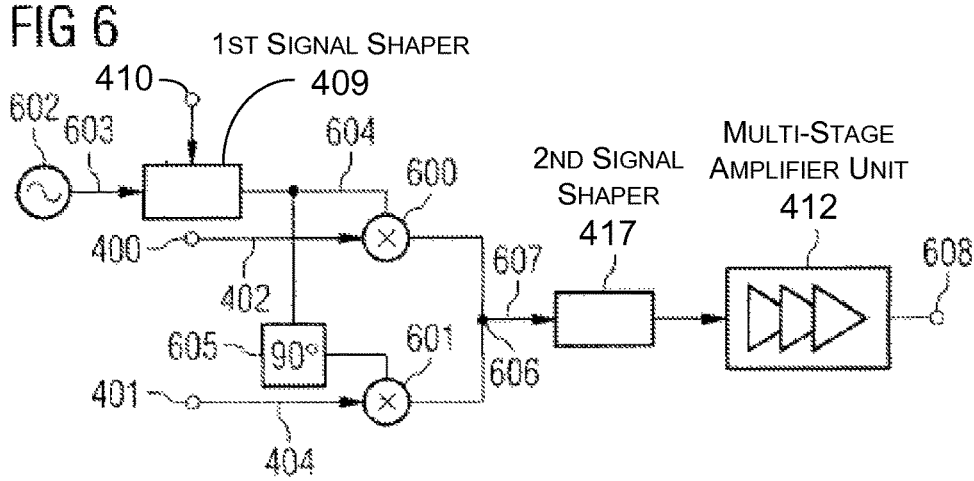
FIG. 6 shows a block diagram of an implementation of a quadrature modulator embodiment of the transmitting apparatus.

FIG. 6 shows a block diagram of an implementation of a quadrature modulator embodiment of the transmitting apparatus. The transmitting apparatus has a first input 400 for supplying an in-phase component of a useful signal comprising an item of information to be transmitted. The transmitting apparatus also has a second input 401 for supplying a quadrature component of the useful signal. A baseband-processing device not illustrated in FIG. 6 provides the quadrature-modulated input signals. In different embodiments, said device comprises a microprocessor or a logic switching mechanism, for example a microcontroller or DSP. The baseband-processing device may be arranged on the same semiconductor component as the transmitting apparatus or may be arranged separately. Different partitioning on different components is likewise conceivable.

The first input 400 connects to a first mixer element 600 by means of a first signal line 402. The second input 401 connects to a second mixer element 601 by means of a second signal line 404. A local oscillator 602 generates a carrier frequency signal. The local oscillator 602 may be in the form of, for example, a voltage-controlled oscillator, a digital or analogue phase-locked loop or in another form. The local oscillator 602 connects to a first signal shaper 409 by means of a third signal line 603. The first signal shaper 409 connects as well to a third input 410. A power information signal is provided at the third input 410. The first signal shaper 409 noise-shapes the carrier frequency signal based on the power information signal to form a second signal having noise components in at least one frequency range remote from the carrier frequency. The first signal shaper 409 provides the second signal on a fourth signal line 604.

The first signal shaper 409 connects to the first mixer element 600 by means of the fourth signal line 604. The first signal shaper 409 connects to the second mixer element 601 by means of the fourth signal line 604 and a phase shifter 605. The phase shifter 605 shifts the phase of the second signal by a phase of 90° or pi/2. The outputs of the first mixer element 600 and of the second mixer element 601 combine at a node 606 and connect to a fifth signal line 607. A quadrature modulator modulates the useful signal onto a carrier frequency signal is provided in this manner. The carrier frequency signal is spectrally changed by the first signal shaper 409 to form the second signal such that, in addition to spectral components at the carrier frequency, it also has spectral components in a frequency range remote from the carrier frequency. The modulated useful signal provided on the fifth signal line 607 correspondingly has spectral components in that frequency range.

The fifth signal line 607 connects to an amplifier unit 412 via a second signal shaper 417. The second signal shaper 417 is, for example, in the form of a bandpass filter that has a band mid-frequency at the carrier frequency or in the vicinity of the latter. The second signal shaper 417 suppresses at least signal components of the third signal in the frequency range remote from the carrier frequency. The second signal shaper 417 may be referred to as a "reconstruction filter". It connects to an amplifier unit 412 that connects to an output 608. The spectrally filtered, amplified and modulated useful signal is provided for being fed into a transmission channel at the output 608 of the transmitting apparatus.

In contrast to the two transmitter apparatus described with reference to FIG. 4 and FIG. 5, the quadrature modulator embodiment has an arrangement of the second signal shaper 417 upstream of the amplifier unit 412 in the signal path. This is particularly advantageous when the amplifier unit has analogue, i.e. linear, amplifiers. However, the measures taken in the different embodiments may also be combined to form other embodiments. This may relate, inter alia, to the use and the arrangement of the second signal shaper 417, the design of the amplifier unit 412 and the design of the transmitting apparatus for a wired or wireless transmission channel.

Figure 7:
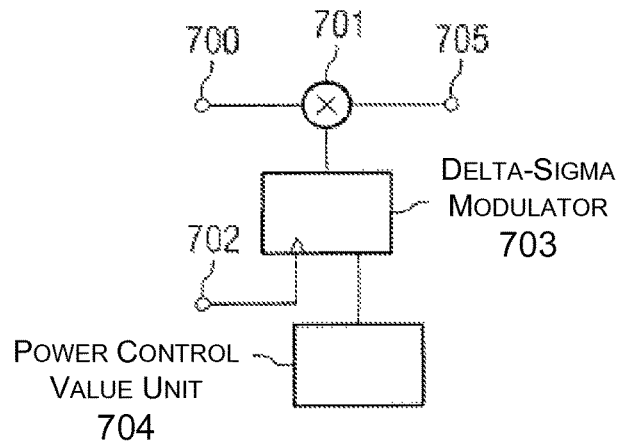
FIG. 7 shows a block diagram of a first implementation of the first signal shaper.

FIG. 7 shows a block diagram of a first implementation of a first signal shaper. The first signal shaper has an input 700 that is used to supply a first signal, for example a carrier frequency signal or a phase-modulated carrier frequency signal. The first input 700 connects to a multiplier 701. The first signal shaper has a second input 702 to receive a clock signal. The second input 702 connects to a delta-sigma modulator 703 clocked by the clock signal. The input of the delta-sigma modulator 703 connects to a power control value unit 704 to supply a power information signal to the delta-sigma modulator 703. The delta-sigma modulator 703 uses the power information signal to generate a first bit stream. The output of the delta-sigma modulator 703 connects to the multiplier 701. In the multiplier 701, the first signal is multiplied by the first bit stream, producing a second bit stream. The output of the multiplier 701 connects to an output 705 at which the second bit stream is provided.

In one embodiment, the frequency of the clock signal may be higher than the carrier frequency. The power information signal is oversampled. The frequency range remote from the carrier frequency, to which components of the first signal are shifted as noise components, thus becomes wider. This advantageously makes it possible to use parasitic capacitances for the reconstruction filter.

Figure 8:
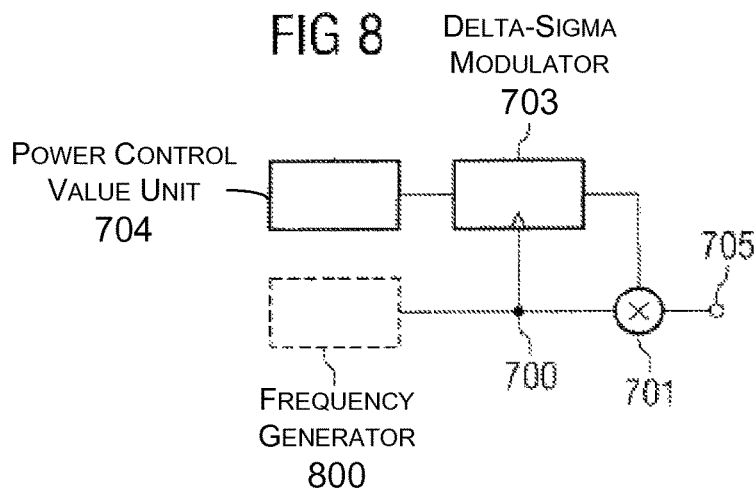
FIG. 8 shows a block diagram of a second implementation of the first signal shaper.

FIG. 8 shows a block diagram of a second implementation of the first signal shaper. In addition to the first implementation described with reference to in FIG. 7, the illustration shows a frequency generator or local oscillator 800 (in dashed lines) which generates the first signal, i.e. the carrier frequency signal or the phase-modulated carrier frequency signal. The first signal is supplied to the multiplier 701 and to the delta-sigma modulator 703 in the form of a clock signal. The delta-sigma modulator 703 may be in the form of a low-pass delta-sigma modulator. The mid-frequency of the noise transfer function is in the vicinity of half the carrier frequency. Since both, the first signal and the first bit stream, have a square-wave signal form which is similar to a digital signal, the multiplier 701 may be formed by simple AND gates. This reduces the complexity during circuit design and implementation in a semiconductor component.

Figure 9:
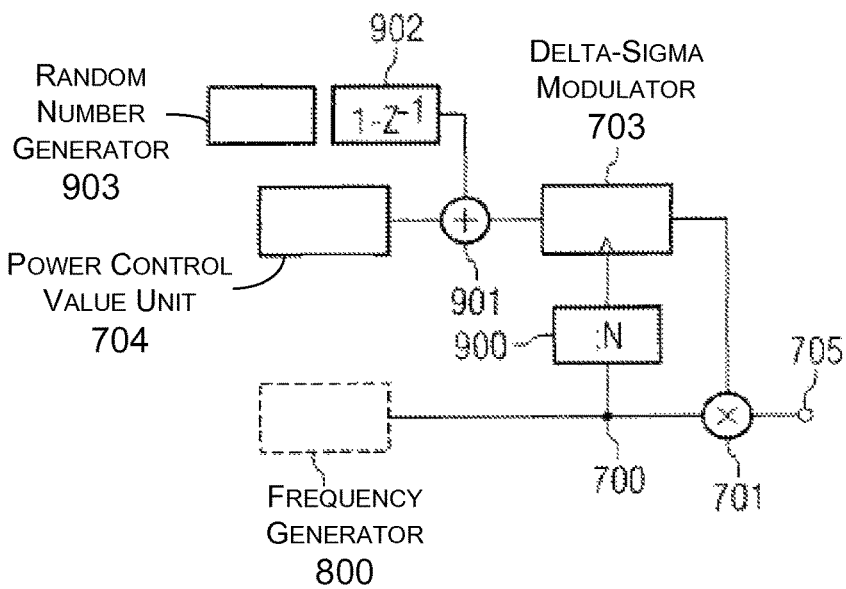
FIG. 9 shows a block diagram of a third implementation of the first signal shaper.

FIG. 9 shows a block diagram of a third implementation of the first signal shaper. In contrast to the second implementation described with reference to FIG. 8, the local oscillator 800 connects to the delta-sigma modulator 703 via a frequency divider 900. The frequency divider divides the first signal by a divisor N and supplies the divided signal to the delta-sigma modulator 703 in the form of a clock signal. The clock signal of the delta-sigma modulator 703 is derived from the first signal. This reduces the clock rate of the delta-sigma modulator 703. A circuit design of the delta-sigma modulator 703 is simplified in comparison with the second implementation shown in FIG. 8. A notch is produced in the power spectrum of the second bit stream for a frequency offset of 1/N of the carrier frequency. The mid-frequency of the noise transfer function is in the vicinity of 1/(2*N) of the carrier frequency. In addition, the maximum noise power density with the value of N increases.

The power control value unit 704 connects to the delta-sigma modulator 703 via an adder 901. In the adder, the output signal from the power control value unit 704 is added to an output signal from a differentiating element 902. The differentiating element 902 derives its output signal from a noise bit stream that is provided by a random number generator 903. The random number generator 903 and the differentiating element 902 connect to one another. The random number generator 903 may generate white noise. In a simpler implementation, the random number generator 903 generates pseudo-noise.

As a result of the addition of differentiated noise term to the output signal by the power control value unit 704, the bit stream generated by the delta-sigma modulator 703 may generate more constant noise components during noise-shaping.

Figure 10:
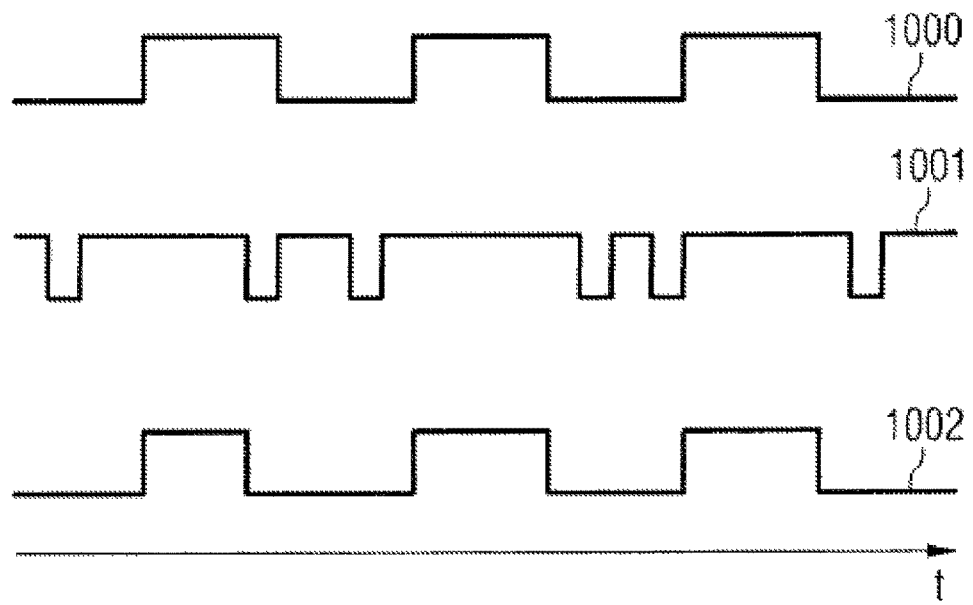
FIG. 10 shows an exemplary illustration of the temporal profiles of the first signal, of a noise-shaping signal and of superposition of the first signal and the noise-shaping signal.

FIG. 10 shows an exemplary illustration of the temporal profiles of the first signal 1000, of a noise-shaping signal 1001 and of superposition 1002 of the first signal and the noise-shaping signal. The noise-shaping signal corresponds to the first bit stream and the second bit stream corresponds to the superposition of the first signal and the noise-shaping signal.

Figure 11:
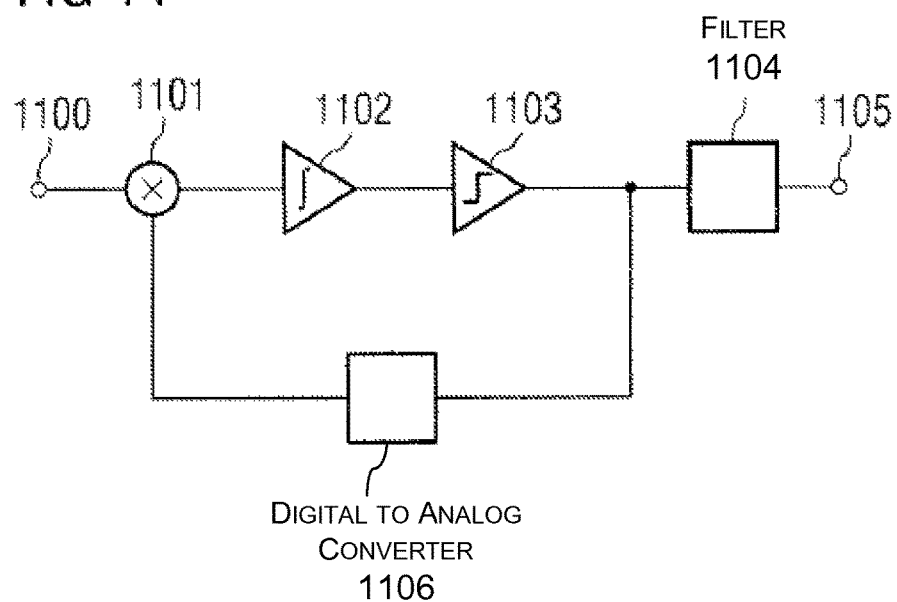
FIG. 11 shows a block diagram of an implementation of a delta-sigma modulator.

FIG. 11 shows a block diagram of an implementation of a delta-sigma modulator. The delta-sigma modulator has an input 1100 to supply a first signal to be modulated. The input 1100 connects to a multiplier 1101. The output of the multiplier 1101 connects to an integrating element 1102. The integrating element 1102 connects to a limiting element 1103. The integrating element 1102 is clocked by an externally supplied clock signal, adds a first data word provided by the multiplier 1101 with each clock signal, and provides the limiting element 1103 with the sum. Said limiting element 1103 limits the value of the sum. The output of the limiting element 1103 connects to an output 1105 via a filter 1104 and connects to the multiplier 1101 via a feedback path. A digital/analogue converter 1106 is arranged in the feedback path. In a manner corresponding to the filter characteristic of the filter 1104, the delta-sigma converter is a low-pass, high-pass or bandpass delta-sigma converter.

FIG. 12 shows a flow diagram of an implementation of one method embodiment for generating a transmission signal. In the method embodiment, a first signal with a first frequency spectrum that has a carrier frequency is generated in a first method step 1200. A power information signal that represents an item of information relating to a signal level of the transmission signal is provided in a second method step 1201. In a third method step 1202, the first signal is noise-shaped based on the power information signal to form a second signal. The second signal has noise components in at least one frequency range remote from the carrier frequency. The second signal may be amplified. Before or after, the noise components of the second signal may be suppressed. This is achieved, for example, by bandpass-filtering the second signal. The second signal is provided in the form of a transmission signal in a fourth method step 1203.

CONCLUSION

For the purpose of this disclosure ant the claims that follows, the term "connect" has been used to describe how various elements interface or couple. Such described interfacing or coupling of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

What is claimed is:

1. A method for generating a transmission signal, said method comprising:
   generating a first phase modulated signal with a first frequency spectrum comprising a carrier frequency;
   providing a power information signal that represents a signal level of the transmission signal residing at the carrier frequency;
   noise-shaping the first phase modulated signal based on the power information signal to form a second signal which has a noise component in at least one frequency range remote from the carrier frequency, the noise component of the second signal being from one or more signal components associated with the carrier frequency;
providing the second signal in the form of a transmission signal; and
wherein the noise shaping the first phase modulated signal includes:
processing the power information signal at a delta-sigma modulator; and
clocking the delta-sigma modulator with the first phase modulated signal.

2. A method according to claim 1, comprising:
amplifying the second signal.

3. A method according to claim 1, comprising:
suppressing the noise components of the second signal.

4. A method according to claim 1, comprising:
bandpass-filtering the second signal.

5. A method according to claim 1, comprising:
phase-modulating the first phase modulated signal in order to apply a first item of information to be transmitted.

6. A method according to claim 5, comprising:
generating the power information signal based on a second item of information to be transmitted.

7. A method according to claim 1, comprising: the noise-shaping operation being carried out using a delta-sigma modulator.

8. An apparatus for generating a transmission signal, said apparatus comprising:
a signal generator that generates a first phase modulated signal with a first frequency spectrum comprising a carrier frequency;
a first signal shaper configured to receive a power information signal and to noise shape the first phase modulated signal based on the power information signal to form a second signal which has a noise component in at least one frequency range remote from the carrier frequency, the noise component of the second signal being from one or more signal components associated with the carrier frequency, wherein the first signal shaper includes a delta-sigma modulator configured to receive the first phase modulated signal at a clock input and to process the power information signal to provide the transmission signal; and
a signal output that provides the second signal in the form of a transmission signal; and
wherein the power information signal is a representation of a signal level of the transmission signal residing at the carrier frequency.

9. An apparatus according to claim 8, comprising: an amplifier that amplifies the second signal.

10. An apparatus according to claim 8, comprising: a second signal shaper that suppresses the noise components of the second signal.

11. An apparatus according to claim 10, the second signal shaper being connected downstream of the amplifier.

12. An apparatus according to claim 10, the amplifier being connected downstream of the second signal shaper.

13. An apparatus according to claim 10, the second signal shaper comprising a bandpass filter.

14. An apparatus according to claim 8, the amplifier comprising a switching amplifier.

15. An apparatus according to claim 8, the amplifier comprising an analogue amplifier.

16. An apparatus according to claim 8, comprising: a first input that connects to the signal generator to supply a phase modulation signal, the signal generator being disposed to generate the first phase modulated signal based on the phase modulation signal.

17. An apparatus according to claim 8, comprising: a second input that connects to a power control unit to supply an amplitude modulation signal, the power control unit being disposed to generate the power information signal based on the amplitude modulation signal.

18. An apparatus according to claim 8, the first phase modulated signal being supplied to the delta-sigma modulator as clock signal via a frequency divider.

19. A transmitter for transmitting a communication signal on a frequency band, comprising:
an input for receiving a power level signal representing a power level of a transmission signal of the transmitter;
a signal generator that generates a first phase modulated signal with a first frequency spectrum comprising a carrier frequency within the frequency band; and
a delta-sigma modulator configured to noise-shape the first phase modulated signal based on the power level signal to form the transmission signal which has a noise component in at least one frequency range within the frequency band and remote from the carrier frequency, the noise component of the transmission signal being from one or more signal components associated with the carrier frequency, wherein the delta-sigma modulator is configured to receive the first phase modulated signal at a clock input and to process the power level signal to provide the transmission signal.

20. A transmitter according to claim 19 comprising a polar modulation architecture.

21. A transmitter according to claim 19 comprising a polar transmit architecture.

22. A transmitter according to claim 19 comprising a Cartesian modulator architecture.

* * * * *